United States Patent
Drost et al.

(10) Patent No.: US 6,194,929 B1
(45) Date of Patent: *Feb. 27, 2001

(54) DELAY LOCKING USING MULTIPLE CONTROL SIGNALS

(75) Inventors: Robert J. Drost, Palo Alto; Jose M. Cruz, Menlo Park; Robert J. Bosnyak, San Jose, all of CA (US)

(73) Assignee: Sun Microsystems, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/883,525

(22) Filed: Jun. 25, 1997

(51) Int. Cl.[7] .................................................. H03L 7/06
(52) U.S. Cl. ........................... 327/156; 327/157; 331/42
(58) Field of Search ............................... 327/157, 158, 327/156, 244, 245, 235; 331/16, 17, 25, 41, 42

(56) References Cited

U.S. PATENT DOCUMENTS

| | | | |
|---|---|---|---|
| 4,167,711 | * 9/1979 | Smoot | 331/17 |
| 4,322,643 | * 3/1982 | Preslar | 331/17 |
| 5,136,260 | * 8/1992 | Yousefi-Elezei | 331/17 |
| 5,138,282 | * 8/1992 | Bailey | 331/17 |
| 5,206,769 | * 4/1993 | Bailey | 331/17 |
| 5,220,294 | * 6/1993 | Ichikawa | 331/17 |
| 5,347,233 | * 9/1994 | Ishibashi | 331/17 |
| 5,384,502 | * 1/1995 | Volk | 327/157 |
| 5,422,604 | * 6/1995 | Jokura | 331/17 |
| 5,602,794 | * 2/1997 | Javanifard | 327/148 |
| 5,614,855 | * 3/1997 | Lee | 327/158 |
| 5,657,359 | * 8/1997 | Sakae | 327/157 |
| 5,663,665 | * 9/1997 | Wang | 327/148 |
| 5,734,301 | * 3/1998 | Lee | 327/148 |
| 5,740,213 | * 4/1998 | Dreyer | 327/157 |

OTHER PUBLICATIONS

S. Sidiropoulos, M. Horowitz, "A Semi–Digital DLL with Unlimited Phase Shift Capability and 0.08–400MHz Operating Range," IEEE Intl Solid–State Circuits Conference Digest of Technical Papers, 1997, pp. 332–333 and accompanying Figure 6.

* cited by examiner

Primary Examiner—Timothy P. Callahan
Assistant Examiner—An T. Luu
(74) Attorney, Agent, or Firm—Skjerven Morrill MacPherson, LLP; Stephen A. Terrile

(57) ABSTRACT

A delay-locked loop includes a phase detection circuit, a charge pump circuit and a phase shift circuit. The phase detection circuit is coupled to receive a first signal and a second signal. The phase detection circuit generates a phase-error output signal indicative of whether the first signal is ahead of or behind the second signal in phase responsive to receiving the first and second signals. The charge pump circuit is coupled to receive a phase-error signal derived from the phase-error output signal. The charge pump circuit generates a plurality of control output signals. Each of the control output signals are based upon the phase-error signal and by at least one signal derived from one other of the control output signals. The phase shift circuit is coupled to receive a plurality of control input signals and a plurality of periodic input signals. The control input signals are derived from the control output signals. Each of the periodic input signals have a different phase. The phase shift circuit applying the control input signals to select from among the periodic input signals to generate a periodic output signal. The periodic output signal being one of the first and second signals.

24 Claims, 10 Drawing Sheets

| REF. | PHASE | $V_{CTL1}$ | $V_{CTL2}$ | $\Phi_1$ SELECTED | $\Phi_2$ SELECTED | OUTPUT | $V_{OFF1}$ | $V_{OFF2}$ |
|---|---|---|---|---|---|---|---|---|
| A | 0° | $V_{MAX}$ | 0V | all | none | $\Phi_1$ | positive | zero |
| B | 45° | 0V ... $V_{MAX}$ | 0V ... $V_{MAX}$ | part | part | ½$\Phi_1$ + ½$\Phi_2$ | positive / zero | zero / positive |
| C | 90° | 0V | $V_{MAX}$ | none | all | $\Phi_2$ | zero | positive |
| D | 135° | $V_{MIN}$ ... 0V | 0V ... $V_{MAX}$ | part | part | ½$\Phi_2$ + ½(-$\Phi_1$) | zero / negative | positive / zero |
| E | 180° | $V_{MIN}$ | 0V | all | none | -$\Phi_1$ | negative | zero |
| F | 225° | $V_{MIN}$ ... 0V | $V_{MIN}$ ... 0V | part | part | ½(-$\Phi_1$) + ½(-$\Phi_2$) | negative / zero | zero / negative |
| G | 270° | 0V | $V_{MIN}$ | none | all | -$\Phi_2$ | zero | negative |
| H | 315° | 0V ... $V_{MAX}$ | $V_{MIN}$ ... 0V | part | part | ½(-$\Phi_2$) + $\Phi_1$ | zero / positive | negative / zero |

Figure 7

DELAY LOCKING USING MULTIPLE CONTROL SIGNALS

BACKGROUND

1. Field of the Invention

The present invention relates to circuitry for generating periodic signals such as clock signals, and, more particularly, to delay lock loops (DLLs).

2. Description of the Related Art

Many high speed electrical systems possess critical timing requirements which dictate the need to generate a periodic clock wave form that possesses a precise time relationship with respect to some reference signal.

Conventionally, a phase-locked loop (PLL) which employs a voltage control oscillator (VCO) is used to provide the desired clock signal. An example of a PLL is shown in FIG. 1a. The classic PLL includes a phase detector, a filter, and a voltage-controlled oscillator (VCO). The PLL phase detector is a device that compares two input frequencies of an external clock and an internal clock (from the VCO), and generates an output that is a measure of their phase difference. For example, if there is a difference in frequency, the phase detector generates a periodic output at the difference frequency. If the frequency of the external clock does not equal the frequency of the internal clock, the phase-error signal, after being filtered and amplified, causes the VCO frequency to deviate in the direction of the external clock frequency. Under the proper conditions, the VCO will lock to the external clock frequency to maintain a fixed phase relationship with the external clock.

While VCO-based PLLs have been used successfully to provide compensation for a variety of timing errors, VCO-based PLLs have some undesirable characteristics. For example, acquisition of the desired timing relationship which requires multiple iterations of signal through the PLL is often slow (typically many hundreds or thousands of clock cycles) because of the time required to drive the VCO to the correct frequency. PLLs often overshoot the target frequency a number of times before locking at the target frequency. Furthermore, designing VCOs with ample power supply rejection characteristics is difficult, particularly when implementing circuitry in CMOS, as power supply voltages utilized in such circuitry are designed to be lower and lower to conserve power.

An alternative PLL circuit is the delay locked loop (DLL) which generates an output signal a predetermined delay from the input reference signal. An example of a DLL is shown in FIG. 1b. A typical DLL includes a phase detector and filter like a PLL. However, the DLL includes a phase shifter instead of a VCO. The DLL corrects a detected phase difference by placing the edges of an internal clock of the proper frequency. In other words, the DLL corrects phase instead of frequency, unlike a VCO. An exemplary DLL is described in U.S. Pat. No. 5,614,855, entitled "Delay-Locked Loop," naming Thomas H. Lee, Kevin S. Donnelly, Tsyr-Chyang Ho and Mark G. Johnson as inventors, which is incorporated herein by reference.

DLLs have traditionally had limited phase shift capability and certain metastability problems. The system in which a DLL is used must typically be limited so that the DLL is never driven into the limit of its phase shift capability. Furthermore, DLLs typically include a single control voltage for selecting among clock phases. For example, a control voltage swings between a minimum voltage and a maximum voltage. The control voltage selects all of a first clock at the minimum voltage and all of a second quadrature clock at the maximum voltage. At intermediate voltages, the control voltage selects portions of each of the clocks. In this way, the control voltage selects for as much as 90° of phase difference. In order to select for further phase difference, a negative of one of the quadrature clocks is digitally selected. However, there can be certain metastability problems due to circuit setup times and accumulated phase-error signals.

SUMMARY

It has been discovered that by using a plurality of control voltages, a more stable method and circuit for generating a periodic clock wave form that possesses a precise time relationship with respect to some reference signal is provided.

In one embodiment of the present invention, a delay-locked loop includes a phase detection circuit, a charge pump circuit and a phase shift circuit. The phase detection circuit is coupled to receive a first signal and a second signal. The phase detection circuit generates a phase-error output signal indicative of whether the first signal is ahead of or behind the second signal in phase responsive to receiving the first and second signals. The charge pump circuit is coupled to receive a phase-error input signal derived from the phase-error output signal. The charge pump circuit generates a plurality of control output signals. Each of the control output signals are based upon the phase-error input signal and by at least one signal derived from one other of the control output signals. The phase shift circuit is coupled to receive a plurality of control input signals and a plurality of periodic input signals. The control input signals are derived from the control output signals. Each of the periodic input signals have a different phase. The phase shift circuit applying the control input signals to select from among the periodic input signals to generate a periodic output signal. The periodic output signal being one of the first and second signals.

In another embodiment of the present invention, a method of determining phase selection signal values in a delay-locked loop is provided. The method includes receiving a reference input signal and a periodic input signal; generating a phase-error signal indicating whether the periodic input signal is slower than or faster than the reference input signal; and generating a plurality of control signals for selecting from among a plurality of internal periodic signals. Each of the internal periodic signals have a different phase. Each of the control signals are based upon a signal derived from the phase-error signal and by at least one signal derived from at least one other of the control signals. The method includes applying signals derived from the control signals to generate an output periodic signal from which the periodic input signal is derived. The output periodic signal is generated in a predetermined timing relationship with the reference input signal by selecting from among the plurality of internal periodic signals.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

FIG. 7 is a table showing system states at various phase reference points according to an embodiment of the invention.

DETAILED DESCRIPTION

The following sets forth a detailed description of a preferred embodiment of the invention. The description is intended to be illustrative of the invention and should not be taken to be limiting. Many variations, modifications, additions, and improvements may fall within the scope of the invention as defined in the claims that follow.

Figure 1A:
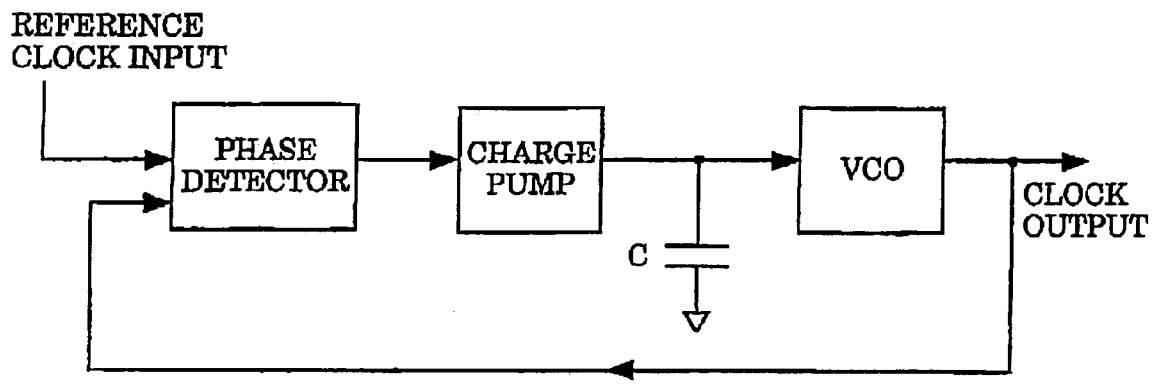
FIG. 1a shows a block diagram of a prior art phase-locked loop.
Figure 1B:
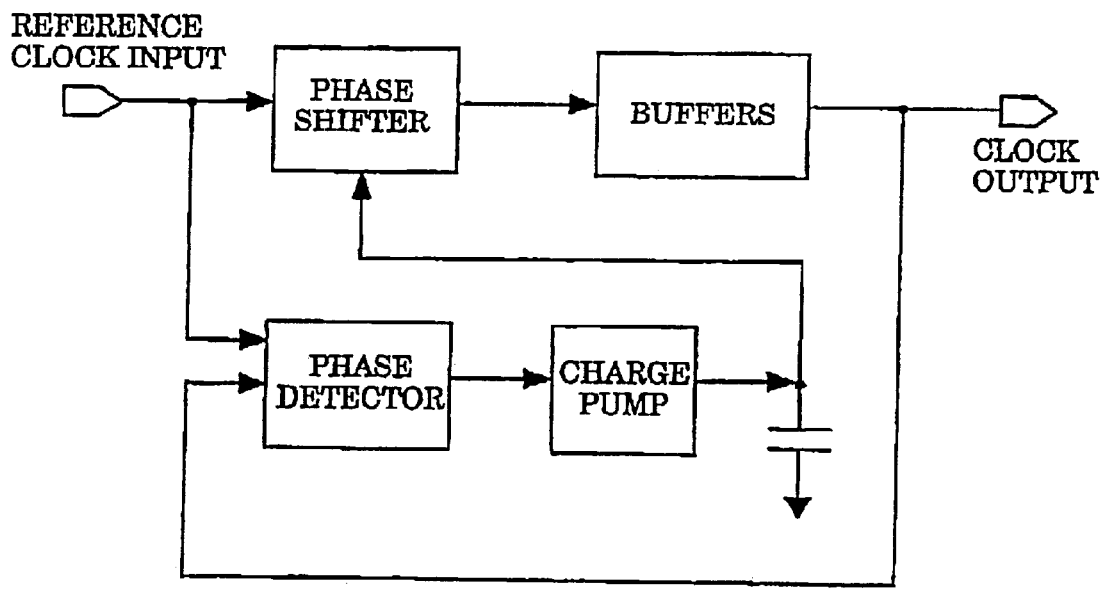
FIG. 1b shows a block diagram of a prior art delay-locked loop.
Figure 2:
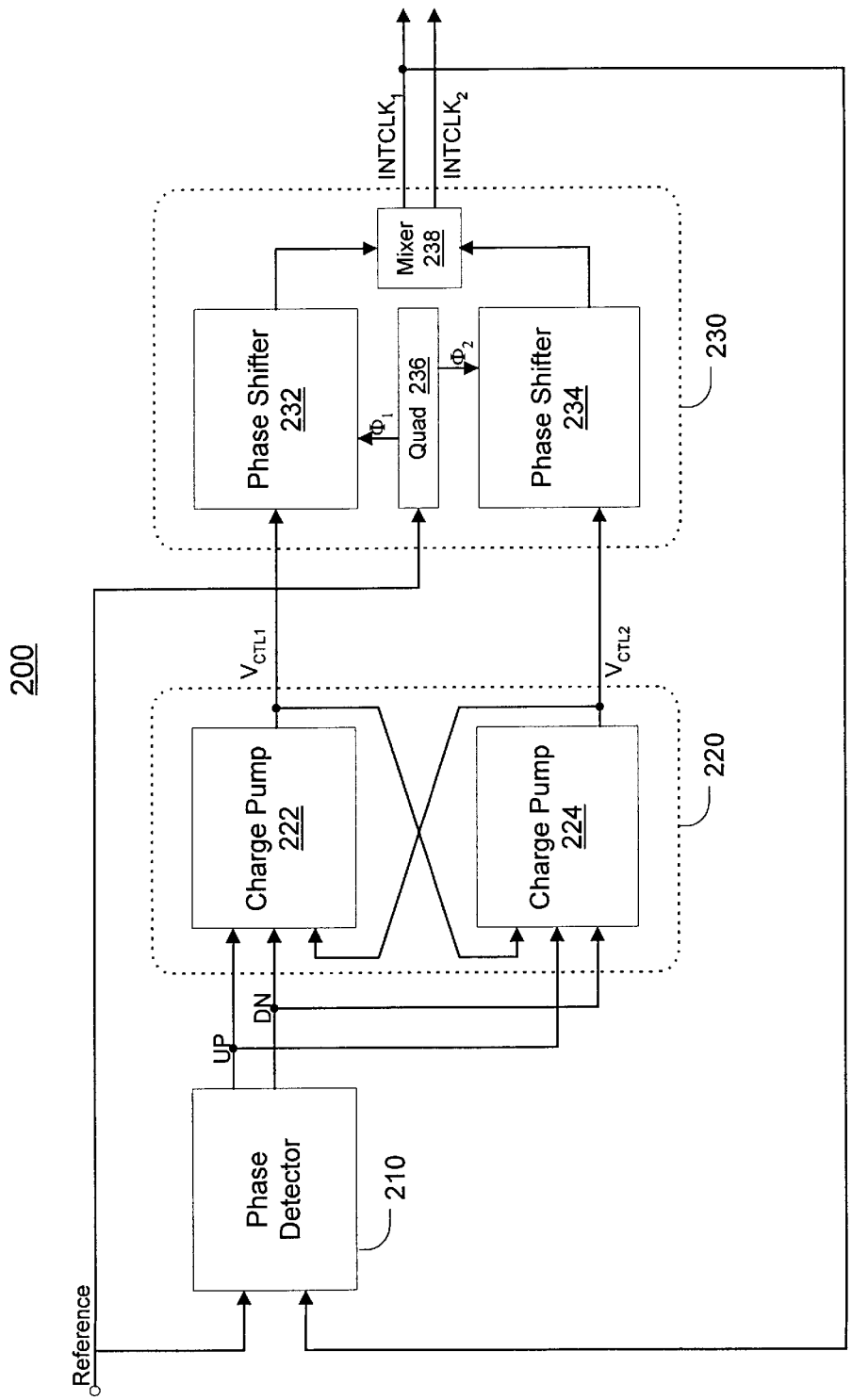
FIG. 2 shows a block diagram of a delay-locked loop according to an embodiment of the invention.

FIG. 2 depicts exemplary DLL 200. DLL 200 includes phase detector 210, charge pump block 220 and phase shift block 230. Charge pump block 220 is coupled between phase detector 210 and phase shift block 230. Charge pump block 220 includes charge pump 222 and charge pump 224. Phase shift block 230 includes phase shifter 232, phase shifter 234, quadrature output oscillator 236 and mixer 238.

Phase detector 210 receives a reference signal and an internal clock signal, and generates a phase-error signal or signals. In the present embodiment, the phase-error signals include a speed up signal UP and a slow down signal DN. The reference signal may either be a reference clock signal or a data signal. If the reference signal is a clock signal, phase detector 210 compares the edges of the reference clock signal with the edges of the internal clock signal to determine if the internal clock signal is too fast or slow, and therefore needs to be slowed down or speeded up, respectively. If the reference signal is a data signal, phase detector 210 samples the reference data signal on edges of the internal clock signal and determines whether the data was sampled before or after transitions, and therefore needs to be slowed down or speeded up, respectively. Phase detector 210 outputs an UP signal pulse of greater width than a DN signal pulse if the internal clock signal needs to be speeded up and a DN signal pulse of greater width than an UP signal pulse if the internal clock signal needs to be slowed down. Such exemplary methods of phase detection and indication are well known in the art. Other types of phase detection and indication may be used in accordance with other embodiments of the invention.

Quadrature output oscillator 236 receives a reference signal and generates quadrature phase clock signals $\Phi_1$ and $\Phi_2$. The reference signal may be the same reference signal received by the phase detector (as shown in FIG. 2) or may be some other reference signal. In the embodiment of FIG. 2, quadrature output oscillator 236 generates two periodic signals in a quadrature phase relationship. Other embodiments may include more periodic signals having different phase relationships.

Charge pump 222 receives UP and DN from phase detector 210 and a voltage control signal $V_{CTL2}$ from charge pump 224. Charge pump 222 generates a voltage control signal $V_{CTL1}$ which selects a first phase clock $\Phi_1$. Charge pump 224 receives UP and DN from phase detector 210 and $V_{CTL1}$ from charge pump 222. Charge pump 224 generates voltage control signal $V_{CTL2}$ which selects a second phase clock $\Phi_2$ which is in quadrature phase to $\Phi_1$. Thus, DLL 200 uses two control voltages $V_{CTL1}$ and $V_{CTL2}$ to select from among two clock signals $\Phi_1$ and $\Phi_2$. In other embodiments, charge pump block 220 may include additional charge pumps to generate additional control voltages to select from among more than two clock signals. Furthermore, charge pump block 220 uses each of the two control voltages to determine the UP/DN correction direction of the other of the two control voltages. The determination of each of the control voltage's correction direction by the other of the control voltages is explained hereinafter with reference to FIGS. 3a, 3b, 5a and 5b.

Figure 4:
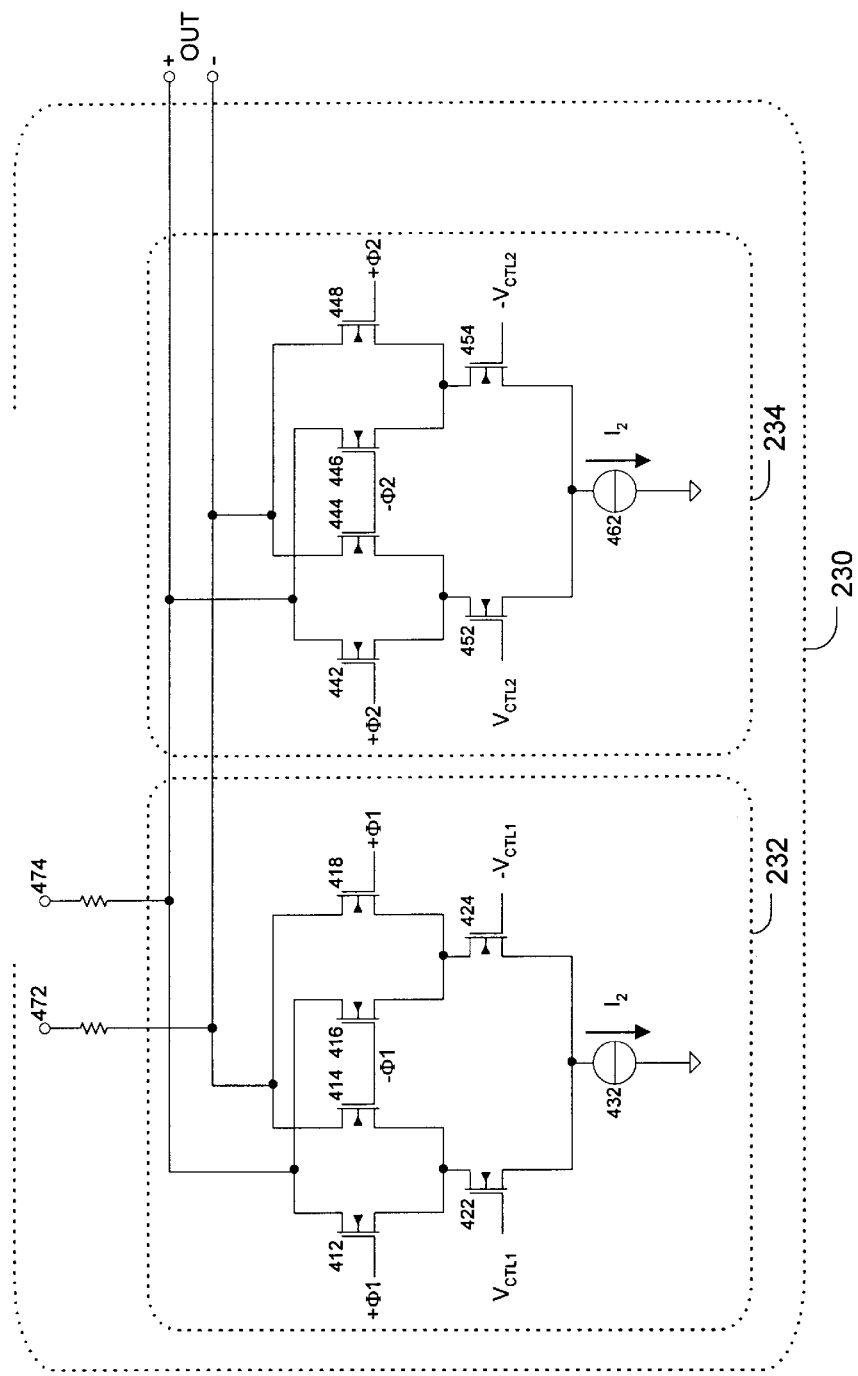
FIG. 4 shows a circuit diagram of a phase shifter according to an embodiment of the invention.

Phase shifter 232 receives $V_{CTL1}$ and $\Phi_1$, and generates a shifted clock signal by selecting all or a portion of $\Phi_1$ depending on the value of $V_{CTL1}$. In the embodiment of FIG. 4, phase shifter 232 generates a shifted clock signal by selecting portions of $\Phi_1$ and the negative of $\Phi_1$, respectively. Phase shifter 234 receives $V_{CTL2}$ and $\Phi_2$, and generates a shifted clock signal by selecting all or a portion of $\Phi_2$ depending on the value of $V_{CTL2}$. In the embodiment of FIG. 4, phase shifter 232 generates a shifted clock signal by selecting portions of $\Phi_2$ and the negative of $\Phi_2$, respectively.

Mixer 238 receives the shifted clock signals from phase shifters 232, 234 and generates internal clock signals $INTCLK_1$ and $INTCLK_2$. Mixing is known in the art. Mixer 238 may simply include a wired connection.

Figure 3A:
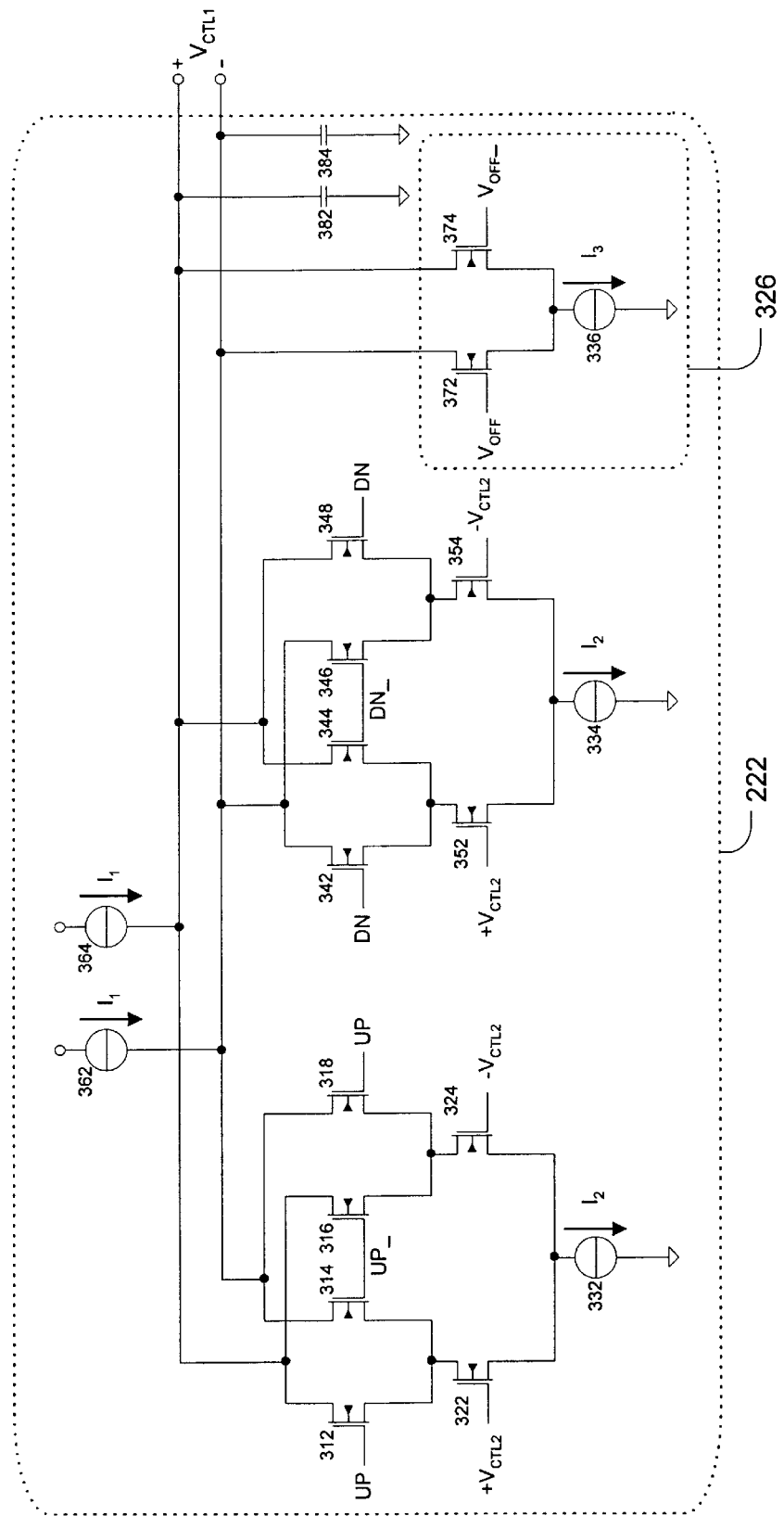
FIGS. 3a and 3b show circuit diagrams of voltage control devices according to an embodiment of the invention.

In the embodiment of FIG. 3a, charge pump 222 includes transistors 312, 314, 316 and 318 for selecting the UP signal to charge capacitors 382 or 384, and transistors 342, 344, 346 and 348 for receiving the DN signal to charge capacitors 382 or 384. Capacitors 382 and 384 hold charges which determine the value of $V_{CTL1}$. Charge pump 222 includes transistors 322, 324, 352 and 354 to select the polarity of change of $V_{CTL1}$ when UP or DN signals (or their negatives, UP_ and DN_, respectively) are received. Although the circuitry for generating UP_ and DN_ is not shown, but any type of circuitry in either phase detector 210 or charge pump block 220 or otherwise may be used to invert the UP or DN signals to generate the UP_ and DN_ signals. Additionally, if the UP/DN signals are already differentially generated through the use of source coupled logic then the UP_/DN_ signals are already available. Charge pump 222 includes current sources 362 and 364 which provide the current to charge capacitors 382 and/or 384. Charge pump 222 includes an amplitude control circuit including amplitude control circuits 326, 327 for regulating the amplitude of the control voltages $V_{CTL1}$ and $V_{CTL2}$. At power-up or reset, the UP and DN signals will both be inactive and will thus sum their differential output currents to produce no differential output current. The $V_{OFF1}/V_{OFF1\_}$ and $V_{OFF2}/V_{OFF2\_}$ signals then set the initial amplitudes of $V_{CTL1}$ and $V_{CTL2}$, respectively, by producing differential offset currents that are converted by the effective output resistance on $V_{CTL1}$ and $V_{CTL2}$ nodes into initial differential offset voltages.

Figure 3B:
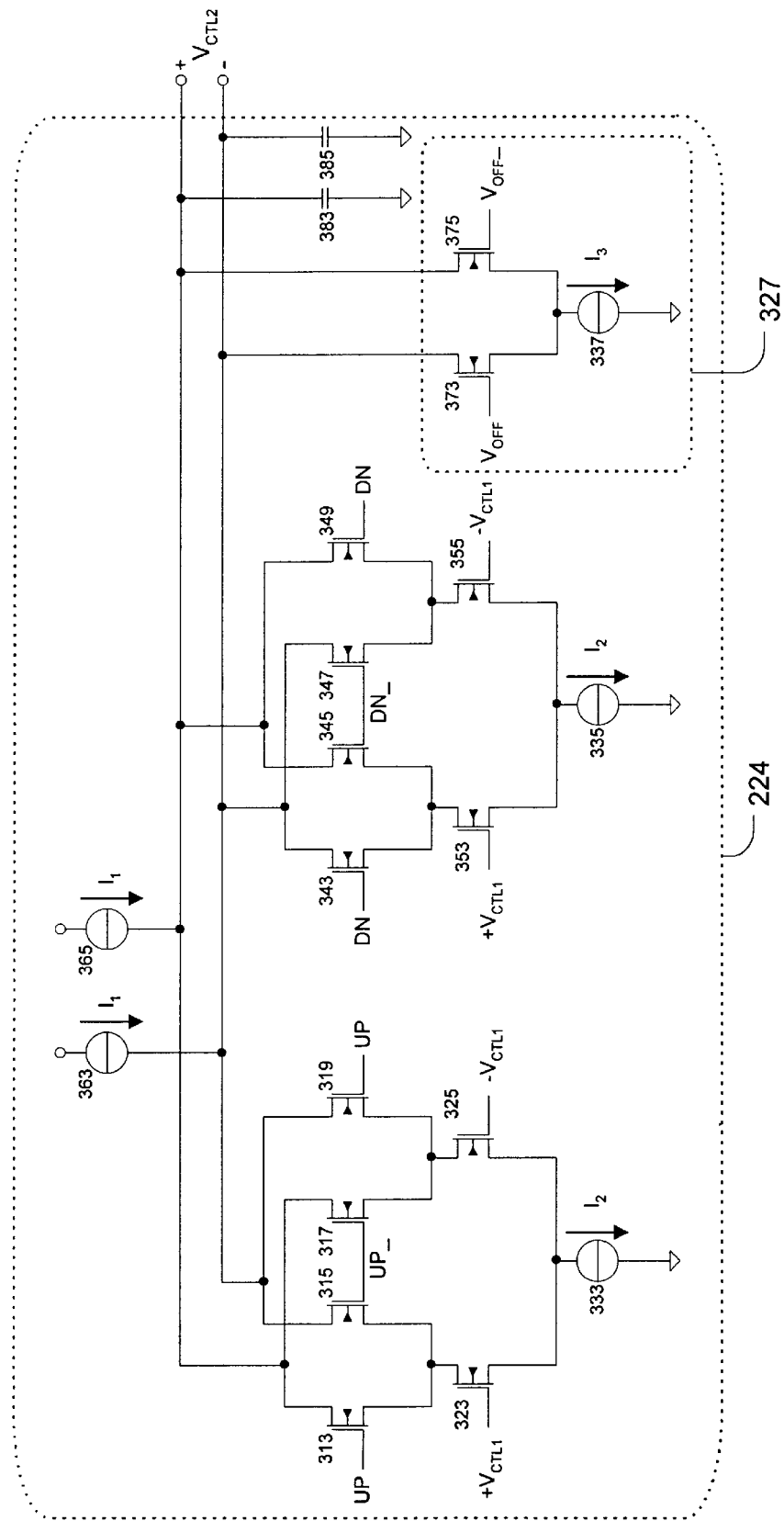

Referring to FIG. 3b, the architecture of charge pump 224 is similar to that of charge pump 222 except that the transistors 323, 325, 353 and 355 of charge pump 223 which correspond to transistors 322, 324, 352 and 354 receive gate voltages corresponding to $V_{CTL1}$ and $-V_{CTL1}$ instead of $V_{CTL2}$ and $-V_{CTL2}$. The operation of charge pump 224 is similar to that of charge pump 222 except that charge pump 224 generates $V_{CTL2}$ and selects the direction of change of $V_{CTL2}$ from $V_{CTL1}$.

Regarding the transistors of the present embodiment, it is noted that a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

The operation of the charge pump 222 of FIG. 3a will now be described in relation to the graph of the control voltages shown in FIG. 5a. $V_{CTL1}$ selects the direction of $V_{CTL2}$ and vice-versa. When $V_{CTL1}$ passes through zero, the direction of change of $V_{CTL2}$ is reversed, and when $V_{CTL2}$ passes through zero, the direction of change of $V_{CTL1}$ is reversed. In FIG. 3a, if UP pulses are being received and $V_{CTL2}$ is positive, transistors 312 and 322 are discharging capacitor 382, thereby decreasing $V_{CTL1}$. If $V_{CTL2}$ then passes through zero to become negative and another UP pulse is received, transistors 318 and 324 are discharging capacitor 384, thereby increasing $V_{CTL1}$. Such a transition occurs at reference point E of FIG. 5a. In this way, the direction of change of voltage of one control voltage is reversed when the other voltage changes sign.

Specifically, if the internal clock signal is in phase with the external reference signal, neither UP nor DN are asserted by phase detector 210. Thus, transistors 312, 318, 342 and 348 are conducting less than transistors 314, 316, 344 and 346. If $V_{CTL2}$ has a value of 0V, then transistors 322, 324, 352 and 354 are equally conducting a small amount of current. Because current sources 362 and 364 generate the same current, capacitors 382 and 384 are similarly charged so that the value of $V_{CTL1}$ remains unchanged. If $V_{CTL2}$ has a positive or a negative value, then either transistors 322 and 352 are conducting more than transistors 324 and 354, or vice-versa. In the first case ($V_{CTL2}>0$), capacitor 382 is discharged via a path including transistors 344, 352 and current source 334, and capacitor 384 is discharged via a path including transistors 314, 322 and current source 332. In the second case ($V_{CTL2}<0$), capacitor 382 is discharged via a path including transistors 316, 324 and current source 332, and capacitor 384 is discharged via a path including transistors 346, 354 and current source 334. Because current sources 332 and 334 draw the same current, capacitors 382 and 384 are similarly discharged so that the value of $V_{CTL1}$ remains unchanged.

If the internal clock signal is slow in relation to the external reference signal, UP is asserted by phase detector 210. Thus, transistors 314, 316, 342 and 348 are conducting less current than transistors 312, 318, 344 and 346. If $V_{CTL2}$ has a value of 0V, then transistors 322, 324, 352 and 354 are equally conducting. The voltage between capacitors 382 and 384, and, therefore, the value of $V_{CTL1}$, remain unchanged. If $V_{CTL2}$ has a positive or a negative value, then either transistors 322 and 352 are conducting more than transistors 324 and 354, or vice-versa. In the first case ($V_{CTL2}>0$), capacitor 382 is discharged via a first path including transistors 312, 322 and current source 332, and via a second path including transistors 344, 352 and current source 334. Because capacitor 382 is discharged and the capacitor 384 is charged by current source 362, $V_{CTL1}$ decreases. In the second case ($V_{CTL2}<0$), capacitor 384 is discharged via a first path including transistors 318, 324 and current source 332, and via a second path including transistors 346, 354 and current source 334. Because capacitor 384 is discharged and capacitor 382 is charged by current source 364, $V_{CTL1}$ increases.

If the internal clock signal is fast in relation to the external reference signal, DN is asserted by phase detector 210. Thus, transistors 312, 318, 344 and 346 are conducting less current than transistors 314, 316, 342 and 348. If $V_{CTL2}$ has a value of 0V, then transistors 322, 324, 352 and 354 are equally conducting. The voltage between capacitors 382 and 384, and, therefore, the value of $V_{CTL1}$, remain unchanged. If $V_{CTL2}$ has a positive or a negative value, then either transistors 322 and 352 are conducting more current than transistors 324 and 354, or vice-versa. In the first case ($V_{CTL2}>0$), capacitor 384 is discharged via a first path including transistors 314, 322 and current source 332, and via a second path including transistors 342, 352 and current source 334. Because capacitor 384 is discharged and capacitor 382 is charged by current source 364, $V_{CTL1}$ increases. In the second case ($V_{CTL2}<0$), capacitor 382 is discharged via a first path including transistors 316, 324 and current source 332, and via a second path including transistors 348, 354 and current source 334. Because capacitor 382 is discharged and capacitor 384 is charged by current source 362, $V_{CTL1}$ decreases.

When phase lock is achieved, the control voltages $V_{CTL1}$ and $V_{CTL2}$ remain unchanged. When the internal clock signal is slow, $V_{CTL1}$ decreases if $V_{CTL2}$ is positive and increases if $V_{CTL2}$ is negative. When the internal clock signal is fast, $V_{CTL1}$ increases if $V_{CTL2}$ is positive and decreases if $V_{CTL2}$ is negative. Similarly, when the internal clock signal is slow, $V_{CTL2}$ increases if $V_{CTL1}$ is positive and decreases if $V_{CTL1}$ is negative. When the internal clock signal is fast, $V_{CTL2}$ decreases if $V_{CTL1}$ is positive and increases if $V_{CTL1}$ is negative.

Amplitude control circuit 326 includes transistors 372 and 374, and current source 336 which draws a current I3. In the displayed embodiment, $I_3$ is equal to approximately 2 microamps so that there is a voltage drop of approximately 500 millivolts across one of transistors 372, 374, as determined by the value of voltage offset signal $V_{OFF}$. When $V_{OFF}$ is positive, transistor 372 conducts more current than transistor 374. In this case, a small current (~2 μA) is drawn from capacitor 384 so that $V_{CTL1}$ increases. When $V_{OFF}$ is negative, transistor 374 conducts more current than transistor 372. In this case, a small current is drawn from capacitor 382 so that $V_{CTL1}$ decreases. When $V_{OFF}$ is 0V, transistors 372 and 374 conduct equally. In this case, no current or an identical amount of current is drawn from capacitors 382 and 384 so that $V_{CTL1}$ remains unchanged. If less or more offset current is needed, the 2 μA current can be decreased or increased as needed. FIG. 7 shows the values of $V_{OFF1}$ and $V_{OFF2}$ as a function of phase.

Figure 5A:
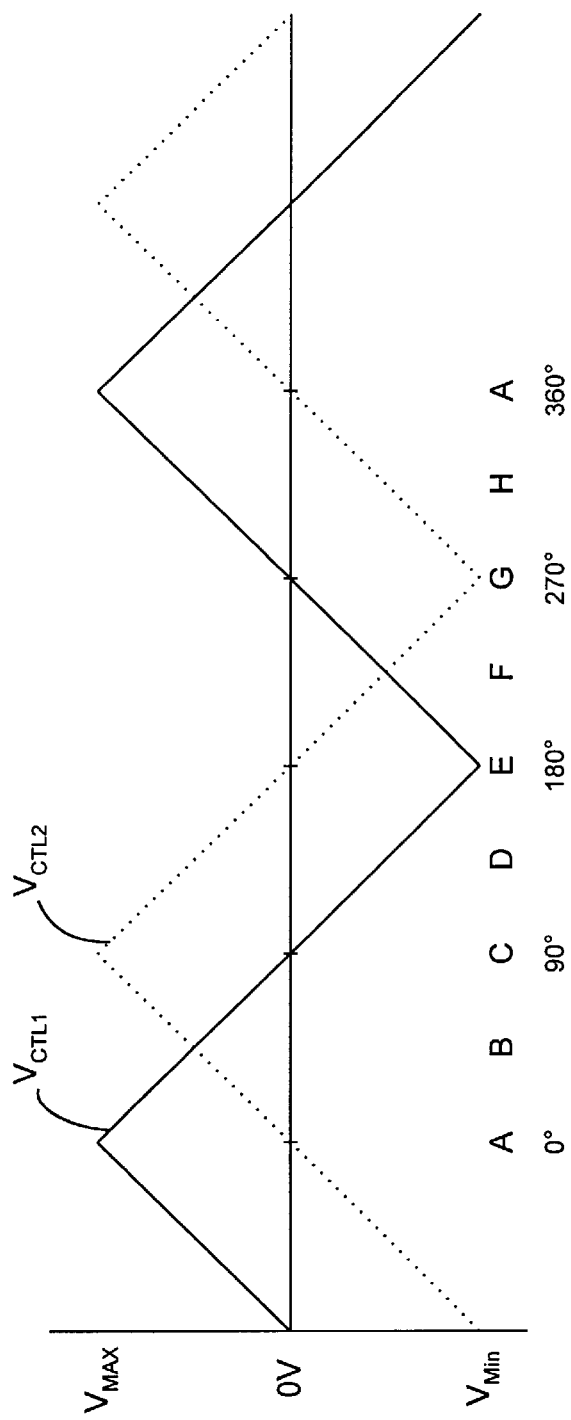
FIGS. 5a and 5b show graphs of two control voltages through the full range of phase shift according to an embodiment of the invention.
Figure 5B:
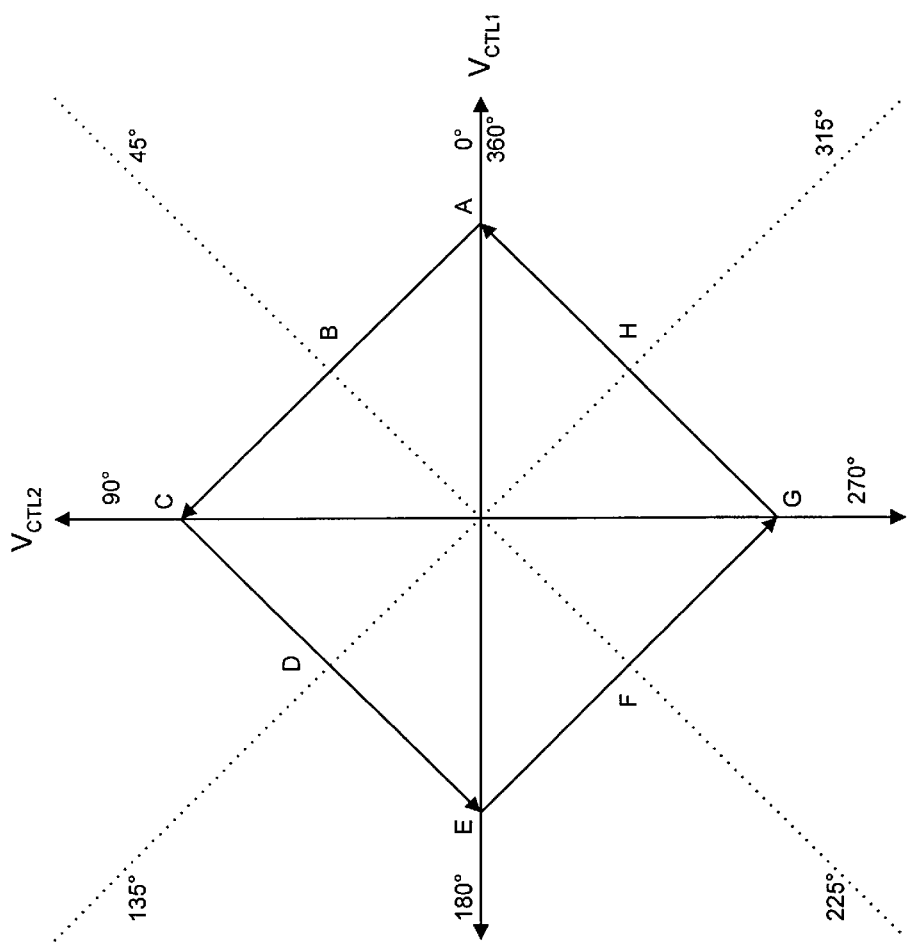

FIG. 5b depicts the control voltages $V_{CTL1}$ and $V_{CTL2}$ graphed as a function of each other. A limit square is shown such that if the control voltages are on the limited square there is no decay or other variation of the control voltages. If the control voltages are inside the limit square, there is decay of the amplitude of at least one of the control voltages. If the control voltages are outside the limit square, then at least one of the voltages has increased in amplitude.

The offset voltage regulates the amplitude of the control voltages by assuring that the voltages always approach the limit square shown. If one of the voltages is smaller than the square voltage, then current is drawn from the voltage's negative capacitor (e.g., for $V_{CTL1}$, capacitor 384), so that the voltage increases to the limit square. If one of the voltages is larger than the square voltage, then current is drawn from the voltages positive capacitor (e.g., for $V_{CTL1}$, capacitor 382), so that the voltage's decreases to the limit square. Thus, the amplitudes of the control voltages $V_{CTL1}$ and $V_{CTL2}$ may be controlled by amplitude control circuits 326, 327 to prevent decay and to ensure that one of the control voltages switches direction before the other control voltage switches direction. FIG. 7 shows the offset voltages $V_{OFF1}$, $V_{OFF2}$ values as a function of phase. FIG. 5b shows that the control voltage's offset values actually lie at the vertices of the limit square. The offset voltages are varied as specified in FIG. 7 to ensure that decay of $V_{CTL1}$, $V_{CTL2}$ to the closest vertice always brings $V_{CTL1}$, $V_{CTL2}$ back closer to the limit square. $V_{OFF1}$, $V_{OFF2}$ values are shown as positive or negative with enough magnitude to entirely switch the current I3.

The control voltages may be amplified to ensure a transfer function at $V_{MIN}$ and $V_{MAX}$. For example, in FIG. 3a, the control voltage applied to the gates of transistors 322, 324, 352 and 354 may be A·$V_{CTL2}$ and A·(-$V_{CTL2}$) instead of $V_{CTL2}$ and -$V_{CTL2}$, where A is a value of amplification. In one embodiment, A is a factor of twenty, but any amount of amplification may be used. Additionally, the amount of phase shift is typically quite small (e.g., 1° or 0.1°), so successive samplings are often required to achieve 90° of phase shift before the other control voltage is required to change direction.

Referring to FIGS. 4, 5a and 5b, $V_{CTL1}$ selects $\Phi_1$, and $V_{CTL2}$ selects $\Phi_2$. In the depicted embodiment, reference points A–H are spaced at 45° intervals beginning at reference point A which is at 0° of phase shift (phase lock). At reference point A, $V_{CTL1}$ is at $V_{MAX}$ (selecting all of $\Phi_1$), and $V_{CTL2}$ is at 0V (selecting none of $\Phi_2$). Through 360° of phase shift, the two control voltages $V_{CTL1}$ and $V_{CTL2}$ in phase shift block 230 select first $\Phi_1$ (phase lock), then $\Phi_1+\Phi_2$ (e.g., $_{1/2}\Phi_1+½\Phi_2$ at 45° out of phase), then $\Phi_2$ (90° out of phase), then $\Phi_2+-\Phi_1$, then $-\Phi_1$, then $-\Phi_1+-_2$, then $-\Phi_2$, then $-\Phi_2+\Phi_1$, then $\Phi_1$, and so on. Each time phases are being added, any portion of one phase is added to any portion of the other phase depending on the value of each control voltage. Differing portions of the phases are continuously being added between the reference points (e.g., between reference points A and B, more of $\Phi_1$ is selected than $\Phi_2$). When phases are not being added, one control voltage is at a maximum (i.e., fully selecting one phase) and the other control voltage is zero (i.e., selecting none of the other phase). The selection of phases may be more fully understood by reference to FIG. 7 which shows the selection of $\Phi$ and $\Phi2$ at the reference points shown in FIGS. 5a and 5b.

Referring again to FIGS. 4 and 5a, when $V_{CTL1}$ is at $V_{MAX}$ and $V_{CTL2}$ is at 0 V (FIG. 5a, reference point A), transistor 422 is fully conducting and transistors 424, 452 and 454 are off. When $\Phi_1$ is positive, more current can conduct through transistors 412 and 418. When both $V_{CTL1}$ and $\Phi_1$ are positive, more current conducts through a path including transistors 412 and 422 than through other paths. Therefore, output node OUT will include more of $\Phi_1$ than $-\Phi_1$ due to a negative voltage applied to terminals 472 and 474. Therefore, OUT oscillates at a value proportional to $\Phi_1$. When $V_{CTL1}$ and $V_{CTL2}$ each have a value between $V_{MAX}$ and 0V (i.e., both are positive—see FIG. 5a, reference point B), both transistors 422 and 452 are partially conducting and OUT includes parts of $\Phi_1$ and $\Phi_2$. When $V_{CTL1}$ is at 0V and $V_{CTL2}$ is at $V_{MAX}$ (reference point C), transistor 452 is fully conducting and transistors 422, 424 and 454 are off. Therefore, OUT oscillates at a value proportional to $\Phi_2$. When $V_{CTL1}$ is negative and $V_{CTL2}$ is positive (reference point D), transistors 424 and 452 are partially conducting and OUT includes parts of $-\Phi_1$ and $\Phi_2$. When $V_{CTL1}$ is at $V_{MIN}$ and $V_{CTL2}$ is 0V (reference point E), transistor 424 is fully conducting and transistors 422, 452 and 454 are off. OUT includes $-\Phi_1$. When $V_{CTL1}$ and $V_{CTL2}$ are negative (reference point F), transistors 424 and 454 are partially conducting and OUT includes parts of $-\Phi_1$ and $-\Phi_2$. When $V_{CTL1}$ is 0V and $V_{CTL2}$ is $V_{MIN}$ (reference point G), transistor 454 is fully conducting and OUT includes $-\Phi_2$. When $V_{CTL1}$ is positive and $V_{CTL2}$ is negative (reference point H), transistors 422 and 424 are partially conducting and OUT includes parts of $\Phi_1$ and $-\Phi_2$.

Figure 6A:
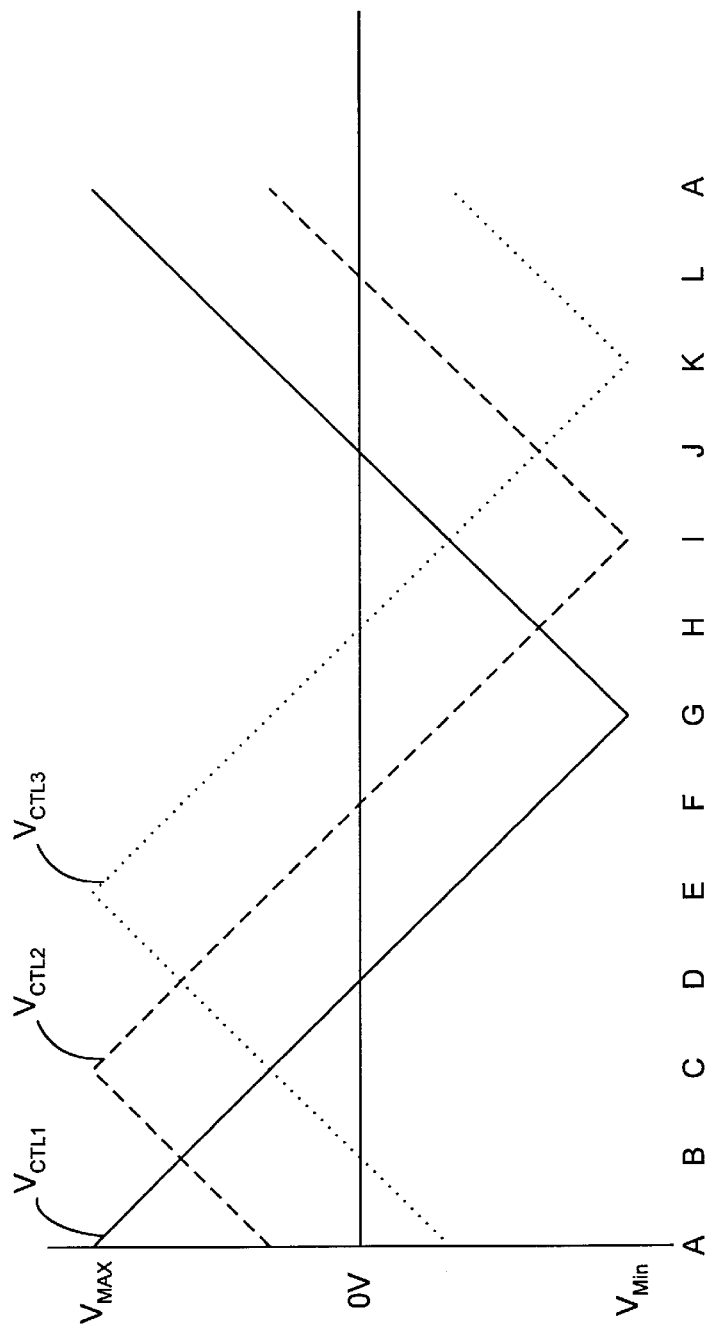
FIGS. 6a and 6b show graphs of three control voltages through the full range of phase shift according to an embodiment of the invention.
Figure 6B:
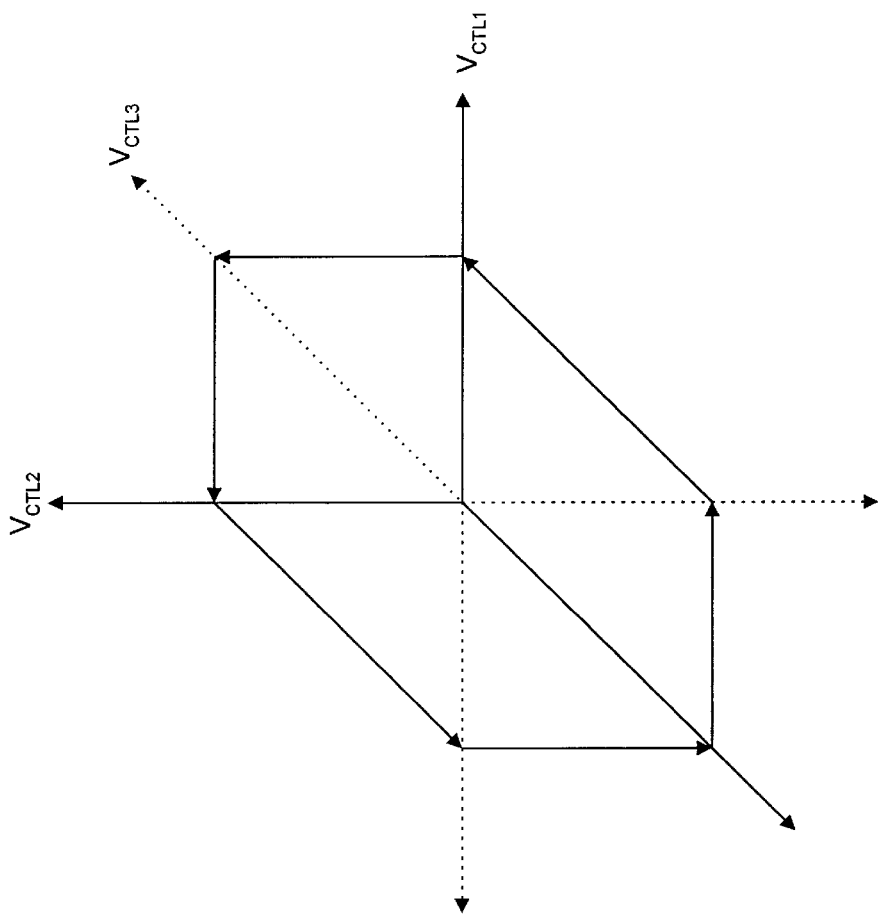

In the above described embodiment, two control signals select from among two quadrature phase clocks. Each of the two control signals select the value of the other of the two control signals. Other embodiments may use three, four or more control signals to select from among any number of clocks. In other embodiments, each of the multiple control signals is determined from at least one other control signal of the multiple control signals. For example, referring to FIGS. 6a and 6b, graphs of the voltages for an embodiment using three control voltages to select from among three periodic signals having 60° phase differences is shown.

While the invention has been described with reference to various embodiments, it will be understood that these embodiments are illustrative and that the scope of the invention is not limited to them. Many variations, modifications, additions, and improvements of the embodiments described are possible. For example, regarding the signals described herein, those skilled in the art will recognize that a signal may be directly transmitted from a first logic block to a second logic block, or a signal may be modified (e.g., amplified, attenuated, delayed, latched, encoded, decoded, inverted, filtered, divided, digitized or otherwise converted, etc.) between the logic blocks. Although the signals of the above described embodiment are characterized as transmitted from one block to the next, other embodiments of the invention include modified signals in place of such directly transmitted signals. To some extent, a second signal input at a second logic block is always a signal derived from a first signal output from a first logic block due to physical limitations of the circuitry involved (e.g., there will always be some attenuation and delay). Therefore, as used herein, a second signal derived from a first signal includes the first signal or any modifications to the first signal, whether due to circuit limitations or due to passage through other circuit elements.

Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. For example, although capacitors 382, 384 and 383, 385 are characterized as being within charge pumps 222 and 224, respectively, such capacitors may be represented as filters separate from charge pumps 222 and 224. Also, a capacitor may simply be differentially applied across the differential control voltages rather than including capacitors to ground such as capacitors 382–385. For further example, although quadrature output oscillator 236 and mixer 238 are shown in phase shift block 230, quadrature output oscillator 236 and mixer 238 may be high level blocks separate from phase shift block 230.

Moreover, alternative embodiments may combine multiple instances of a particular component. In the above described embodiment, a single phase shift circuit generates a single output clock. In other embodiments, a DLL includes multiple phase shift circuits to generate multiple output clocks having different phase shifts but similar frequencies. For example, four phase shift circuits (each with a corresponding mixer) can receive different quadrature phase signals to produce four output clocks of the same frequency that are each shifted by 90° from each other. The first phase shift circuit includes a first phase shifter (e.g., 232) which receives $\Phi_1$ and a second phase shifter (e.g., 234) which receives $\Phi_2$ to generate an output clock having a 0° relative phase. The second phase shift circuit includes a first phase shifter which receives $\Phi_2$ and a second phase shifter which receives $-\Phi_1$ to generate an output clock having a 90° relative phase. The third phase shift circuit includes a first phase shifter which receives $-\Phi_1$ and a second phase shifter which receives $-\Phi_2$ to generate an output clock having a 180° relative phase. The fourth phase shift circuit includes a first phase shifter which receives $-\Phi_2$ and a second phase shifter which receives $\Phi_1$ to generate an output clock having a 270° relative phase. One of the clocks is chosen to feed back to phase detector 210 so that the other three signals are locked at phase relationships of +90°, +180° and +270° to the reference input signal. For further example, embodiments with two or three output phases may be implemented in a manner similar to the above description with only two or three of the above phase shift circuits. These and other variations, modifications, additions, and improvements may fall within the scope of the invention as defined in the claims which follow.

What is claimed is:

1. A delay-locked loop comprising:

a phase detection circuit coupled to receive a first signal and a second signal, the phase detection circuit generating a phase-error output signal indicative of whether the first signal is ahead of or behind the second signal in phase responsive to receiving the first and second signals;

a charge pump circuit coupled to receive a phase-error input signal derived from the phase-error output signal, the charge pump circuit generating a plurality of control output signals, each of the control output signals being based upon the phase-error input signal and being based upon at least one signal derived from one other of the control output signals, the charge pump circuit generating first and second control output signals, the charge pump circuit including a first charge pump coupled to receive the phase-error input signal and a signal derived from the second control output signal, the first charge pump determining the value of the first control output signal responsive to a value of the phase-error input signal and responsive to whether the signal derived from the second control output signal is within one of a first and second range;

a second charge pump coupled to receive the phase-error input signal and a signal derived from the first control output signal, the second charge pump determining the value of the second control output signal responsive to a value of the phase-error signal and responsive to whether the signal derived from the first control output signal is within another of a first and second range; and, a phase shift circuit coupled to receive a plurality of control input signals and a plurality of periodic input signals, the control input signals derived from the control output signals, each of the periodic input signals having a different phase, the phase shift circuit applying the control input signals to select from among the periodic input signals to generate a periodic output signal, the periodic output signal being one of the first and second signals; wherein the first charge pump causes the value of the first control output signal to change value in a first direction responsive to the phase-error input signal indicating the first signal is ahead of the second signal in phase and the signal derived from the second control output signal being within the first range;

change value in a second direction responsive to the phase-error input signal indicating the first signal is ahead of the second signal in phase and the signal derived from the second control output signal being within the second range;

change value in the second direction responsive to the phase-error input signal indicating the first signal is behind the second signal in phase and the signal derived from the second control output signal being within the first range; and change value in the first direction responsive to the phase-error input signal indicating the first signal is behind the second signal in phase and the signal derived from the second control output signal being within the second range; and the second charge pump causes the value of the second control output signal to change value in the first direction responsive to the phase-error input signal indicating the first signal is ahead of the second signal in phase and the signal derived from the first control signal being within the first range;

change value in the second direction responsive to the phase-error input signal indicating the first signal is ahead of the second signal in phase and the signal derived from the first control signal being within the second range;

change value in the second direction responsive to the phase-error input signal indicating the first signal is behind the second signal in phase and the signal derived from the first control signal being within the first range; and change value in the first direction responsive to the phase-error input signal indicating the first signal is behind the second signal in phase and the signal derived from the first control signal being within the second range.

2. The delay-locked loop of claim 1 wherein the change in value in the first direction is an increase in voltage; and the change in value in the second direction is a decrease in voltage.

3. The delay-locked loop of claim 1 wherein the phase-error input signal comprises:

a first signal indicating the first signal is ahead of the second signal in phase; and a second signal indicating the first signal is behind the second signal in phase.

4. The delay-locked loop of claim 1 wherein the first range includes only positive values; and the second range includes only negative values.

5. A delay-locked loop comprising:

a phase detection circuit coupled to receive a first signal and a second signal, the phase detection circuit generating a phase-error output signal indicative of whether the first signal is ahead of or behind the second signal in phase responsive to receiving the first and second signals;

a charge pump circuit coupled to receive a phase-error input signal derived from the phase-error output signal, the charge pump circuit generating a plurality of control output signals, each of the control output signals being based upon the phase-error input signal and being based upon at least one signal derived from one other of the control output signals, the charge pump circuit generating first and second control output signals, the charge pump circuit including a first charge pump coupled to receive the phase-error input signal and a signal derived from the second control output signal, the first charge pump determining the value of the first control output signal responsive to a value of the phase-error input signal and responsive to whether the signal derived from the second control output signal is within one of a first and second range, the first charge pump including a first amplitude control circuit for maintaining the first control output signal in a voltage limit cycle greater than zero volts and less than a saturation voltage of the first charge pump; and a second charge pump coupled to receive the phase-error input signal and a signal derived from the first control output signal, the second charge pump determining the value of the second control output signal responsive to a value of the phase-error -signal and responsive to whether the signal derived from the first control output signal is within another of a first and second range, the second charge pump including a second amplitude control circuit for maintaining the second control output signal in a voltage limit cycle greater than zero volts and less than a saturation voltage of the second charge pump. and, a phase shift circuit coupled to receive a plurality of control input signals and a plurality of periodic input signals, the control input signals derived from the control output signals, each of the periodic input signals having a different phase, the phase shift circuit applying the control input signals to select from among the periodic input signals to generate a periodic output signal, the periodic output signal being one of the first and second signals; wherein the first and second amplitude control circuits direct the first and second control output signals to voltages such that the limit cycle is a limit square defined by a sum of absolute values of the voltages of the first and second control output signals.

6. The delay-locked loop of claim 5, wherein the first charge pump includes a first amplitude control circuit coupled to receive a first offset control voltage, the first amplitude control circuit regulating the amplitude of the first control output signal by changing the first control output signal in a first direction when the first offset control voltage is in a first range and changing the first control output signal in a second direction when the first offset control voltage is in a second range; and the second charge pump includes a second amplitude control circuit coupled to receive a second offset control voltage, the second amplitude control circuit regulating the amplitude of the second control output signal by changing the second control output signal in a first direction when the second offset control voltage is in a first range and changing the second control output signal in a second direction when the second offset control voltage is in a second range.

7. The delay-locked loop of claim 5 wherein the periodic input signals include first and second periodic signals having a quadrature phase relationship; and the phase shift circuit includes a first phase shifter coupled to receive a first control input signal derived from the first control output signal and coupled to receive the first periodic signal, the first phase shifter generating a first phase shift signal derived from a percentage of the first periodic signal, the percentage of the first periodic signal being based upon the first control input signal;

a second phase shifter coupled to receive a first control input signal derived from the second control output signal and coupled to receive the second periodic signal, the second phase shifter generating a second phase shift signal derived from a percentage of the second periodic signal, the percentage of the second periodic signal being based upon the second input control signal; and a mixing circuit for combining the first and second phase shift signals.

8. The delay-locked loop of claim 5 wherein the first signal is a reference signal; and the second signal is the periodic output signal.

9. The delay-locked loop of claim 5 further comprising:

a periodic signal generation circuit coupled to receive a signal derived from the first signal, the periodic signal generation circuit generating a plurality of periodic signals from which the periodic input signals received by the phase shift circuit are derived, each of the plurality of periodic signals having a phase, the phases of the plurality of periodic signals having a uniform phase distribution.

10. A method of determining phase selection signal values in a delay-locked loop, the method comprising:
receiving a reference input signal and a periodic input signal;
generating a phase-error signal indicating whether the periodic input signal is slower than or faster than the reference input signal;
generating a plurality of control signals for selecting from among a plurality of internal periodic signals, each of the internal periodic signals having a different phase, each of the control signals being based upon a signal derived from the phase-error signal and being based upon at least one signal derived from at least one other of the control signals;
applying signals derived from the control signals to generate an output periodic signal from which the periodic input signal is derived, the output periodic signal being generated in a predetermined timing relationship with the reference input signal by selecting from among the plurality of internal periodic signals.

11. The method of claim 10 wherein the generating the plurality of control signals comprises
generating a first control signal responsive to a value of the phase-error signal and responsive to whether a signal derived from a second control signal is within one of a first and second range;
generating a second control signal responsive to a value of the phase-error signal and responsive to whether a signal derived from the first control signal is within another of a first and second range.

12. The method of claim 11 further comprising:
maintaining the first and second control signal s in a voltage limit cycle greater than zero volts and less than a saturation voltage of a circuit generating the first and second control signals.

13. A method of determining phase selection signal values in a delay-locked loop, the method comprising:
receiving a reference input signal and a periodic input signal;
generating a phase-error signal indicating whether the periodic input signal is slower than or faster than the reference input signal;
generating a plurality of control signals for selecting from among a plurality of internal periodic signals, each of the internal periodic signals having a different phase, each of the control signals being based upon a signal derived from the phase-error signal and being based upon at least one signal derived from at least one other of the control signals, the generating the plurality of control signals including
generating a first control signal responsive to a value of the phase-error signal and responsive to whether a signal derived from a second control signal is within one of a first and second range; the generating the first control signal includeing
changing the first control signal in a first direction responsive to the phase-error signal indicating the periodic input signal is ahead of the reference input signal in phase and the signal derived from the second control signal being within the first range;
changing the first control signal in a second direction responsive to the phase-error signal indicating the periodic input signal is ahead of the reference input signal in phase and the signal derived from the second control signal being within the second range;
changing the first control signal in the second direction responsive to the phase-error signal indicating the periodic input signal is behind the reference input signal in phase and the signal derived from the second control signal being within the first range; and
changing the first control signal in the first direction responsive to the phase-error signal indicating the periodic input signal is behind the reference input signal in phase and the signal derived from the second control signal being within the second range; and
generating a second control signal responsive to a value of the phase-error signal and responsive to whether a signal derived from the first control signal is within another of a first and second range, the generating the second control signal includeing
changing the second control signal in the first direction responsive to the phase-error signal indicating the periodic input signal is ahead of the reference input signal in phase and the signal derived from the first control signal being within the first range;
changing the second control signal in the second direction responsive to the phase-error signal indicating the periodic input signal is ahead of the reference input signal in phase and the signal derived from the first control signal being within the second range;
changing the second control signal in the second direction responsive to the phase-error signal indicating the periodic input signal is behind the reference input signal in phase and the signal derived from the first control signal being within the first range; and
changing the second control signal in the first direction responsive to the phase-error signal indicating the periodic input signal is behind the reference input signal in phase and the signal derived from the first control signal being within the second range; and,
applying signals derived from the control signals to generate an output periodic signal from which the periodic input signal is derived, the output periodic signal being generated in a predetermined timing relationship with the reference input signal by selecting from among the plurality of internal periodic signals.

14. The method of claim 13 wherein
the changing in the first direction is an increase in voltage; and
the changing in the second direction is a decrease in voltage.

15. The method of claim 13 wherein the generating a phase-error signal comprises:
generating a first signal indicating when the periodic input signal is ahead of the reference input signal in phase; and
generating a second signal indicating when the periodic input signal is behind the reference input signal in phase.

16. The method of claim 13 wherein
the first range includes only positive values; and
the second range includes only negative values.

17. A method of determining phase selection signal values in a delay-locked loop, the method comprising:
  receiving a reference input signal and a periodic input signal;
  generating a phase-error signal indicating whether the periodic input signal is slower than or faster than the reference input signal;
  generating a plurality of control signals for selecting from among a plurality of internal periodic signals, each of the internal periodic signals having a different phase, each of the control signals being based upon a signal derived from the phase-error signal and being based upon at least one signal derived from at least one other of the control signals, the generating the plurality of control signals including
    generating a first control signal responsive to a value of the phase-error signal and responsive to whether a signal derived from a second control signal is within one of a first and second range;
    generating a second control signal responsive to a value of the phase-error signal and responsive to whether a signal derived from the first control signal is within another of a first and second range;
  applying signals derived from the control signals to generate an output periodic signal from which the periodic input signal is derived, the output periodic signal being generated in a predetermined timing relationship with the reference input signal by selecting from among the plurality of internal periodic signals;
  maintaining the first and second control signals in a voltage limit cycle greater than zero volts and less than a saturation voltage of a circuit generating the first and second control signals; and
  generating the first and second control signals such that the limit cycle is a limit square defined by a sum of absolute values of voltages of the first and second control signals.

18. The method of claim 17 further comprising:
  generating a first offset control voltage in the first range when the reference input signal and the periodic input signal are in a first range of phase relationships and the second range when the reference input signal and the periodic input signal are in a second range of phase relationships;
  generating a second offset control voltage in the first range when the reference input signal and the periodic input signal are in a third range of phase relationships and the second range when the reference input signal and the periodic input signal are in a fourth range of phase relationships;
  regulating the amplitude of the first control signal by changing the first control signal in a first direction when the first offset control voltage is in the first range and changing the first control signal in a second direction when the first offset control voltage is in the second range; and
  regulating the amplitude of the second control signal by changing the second control signal in a first direction when the second offset control voltage is in the third range and changing the second control signal in a second direction when the second offset control voltage is in the fourth range.

19. The method of claim 17 further comprising:
  generating first and second internal periodic signals having a quadrature phase relationship;
  generating a first phase shift signal derived from a percentage of the first internal periodic signal, the percentage of the first internal periodic signal being based upon the first control signal;
  generating a second phase shift signal derived from a percentage of the second internal periodic signal, the percentage of the second internal periodic signal being based upon the second control signal; and
  mixing the first and second phase shift signals.

20. A system for determining phase selection signal values in a delay-locked loop, the system comprising:
  means for generating a phase-error signal indicating whether a first signal is slower than or faster than a second signal the means for generating the phase-error signal including
    means for generating a first phase-error signal indicating the first signal is ahead of the second signal in phase; and
    means for generating a second phase-error signal indicating the first signal is behind the second signal in phase;
  means for generating a plurality of control signals for selecting from among a plurality of internal periodic signals, each of the internal periodic signals having a different phase, each of the control signals being based upon the phase-error signal and at least one other of the control signals, the means for generating the plurality of control signals including
    means for generating a first control signal responsive to a value of the phase-error signal and responsive to whether a second control signal is withinone of a first and second range, the means for generating the first control signal includeing
      means for changing the first control signal in a first direction responsive to the phase-error signal indicating the first signal is ahead of the second signal in phase and the second control signal is within the first range;
      means for changing the first control signal in a second direction responsive to the phase-error signal indicating the first signal is ahead of the second signal in phase and the second control signal is within the second range;
      means for changing the first control signal in the second direction responsive to the phase-error signal indicating the first signal is behind the second signal in phase and the second control signal is within the first range; and
      means for changing the first control signal in the first direction responsive to the phase-error signal indicating the first signal is behind the second signal in phase and the second control signal is within the second range; and
    means for generating the second control signal responsive to a value of the phase-error signal and responsive to whether the first control signal is within another of a first and second range; the means for generating the second control signal includeing
      means for changing the second control signal in the first direction responsive to the phase-error signal indicating the first signal is ahead of the second signal in phase and the first control signal is within the first range;

means for changing the second control signal in the second direction responsive to the phase-error signal indicating the first signal is ahead of the second signal in phase and the first control signal is within the second range;

means for changing the second control signal in the second direction responsive to the phase-error signal indicating the first signal is behind the second signal in phase and the first control signal is within the first range; and means for changing the second control signal in the first direction responsive to the phase-error signal indicating the first signal is behind the second signal in phase and the first control signal is within the second range;

means for generating the first signal in a predetermined timing relationship with the second signal by selecting from among the plurality of internal periodic signals.

21. A system for determining phase selection signal values in a delay-locked loop, the system comprising:

means for generating a phase-error signal indicating whether a first signal is slower than or faster than a second signal the means for generating the phase-error signal including means for generating a first phase-error signal indicating the first signal is ahead of the second signal in phase; and means for generating a second phase-error signal indicating the first signal is behind the second signal in phase;

means for generating a plurality of control signals for selecting from among a plurality of internal periodic signals, each of the internal periodic signals having a different phase, each of the control signals being based upon the phase-error signal and at least one other of the control signals, the means for generating the plurality of control signals including means for generating a first control signal responsive to a value of the phase-error signal and responsive to whether a second control signal is withinone of a first and second range; and means for generating the second control signal responsive to a value of the phase-error signal and responsive to whether the first control signal is within another of a first and second range means for generating the first signal in a predetermined timing relationship with the second signal by selecting from among the plurality of internal periodic signals; and means for maintaining the first and second control signals in a voltage limit cycle greater than zero volts and less than a saturation voltage of a circuit generating the first and second control signals.

22. The system of claim 21 further comprising: means for generating the first and second control signals such that the limit cycle is a limit square defined by a sum of absolute values of voltages of the first and second control signals.

23. The system of claim 21 further comprising:

means for generating a first offset control voltage in the first range when the signal and the second signal are in a first range of phase relationships;

means for generating the first offset control voltage in the second range when the first signal and the second signal are in a second range of phase relationships;

means for generating a second offset control voltage in the first range when the first signal and the second signal are in a third range of phase relationships;

means for generating the second offset control voltage in the second range when the first signal and the second signal are in a fourth range of phase relationships;

means for regulating an amplitude of the first control signal by changing the first control signal in a first direction when the first offset control voltage is in the first range and changing the first control signal in a second direction when the first offset control voltage is in the second range; and means for regulating an amplitude of the second control signal by changing the second control signal in a first direction when the second offset control voltage is in the third range and changing the second control signal in a second direction when the second offset control voltage is in the fourth range.

24. The system of claim 21 wherein the internal periodic signals include first and second internal periodic signals having a quadrature phase relationship; and the system further includes means for generating a first phase shift signal derived from a percentage of a first internal periodic signal, the percentage of the first internal periodic signal being based upon the first control signal;

means for generating a second phase shift signal derived from a percentage of the second internal periodic signal, the percentage of the second internal periodic signal being based upon the second control signal; and a mixer mixing the first and second phase shift signals responsive to receiving the first and second phase shift signals.

* * * * *